United States Patent
Tseng

(10) Patent No.: US 8,885,352 B2
(45) Date of Patent: Nov. 11, 2014

(54) POWER SUPPLY MODULE OF LINEAR ACTUATOR AND CONVERSION ASSEMBLY THEREOF

(75) Inventor: Kuan-Shu Tseng, New Taipei (TW)

(73) Assignee: Timotion Technology Co., Ltd., New Taipei (TW)

( * ) Notice: Subject to any disclaimer, the term of this patent is extended or adjusted under 35 U.S.C. 154(b) by 362 days.

(21) Appl. No.: 13/429,604

(22) Filed: Mar. 26, 2012

(65) Prior Publication Data

US 2013/0155633 A1    Jun. 20, 2013

(30) Foreign Application Priority Data

Dec. 14, 2011   (TW) .............................. 100146362 A

(51) Int. Cl.
| | | |
|---|---|---|
| *H05K 5/00* | (2006.01) | |
| *H01J 5/00* | (2006.01) | |
| *H01J 15/00* | (2006.01) | |
| *H02G 3/08* | (2006.01) | |

(52) U.S. Cl.
USPC ............................................ 361/752; 174/50

(58) Field of Classification Search
CPC ..... H05K 7/142; H05K 7/1417; H05K 3/284; H05K 1/141; H05K 1/144; H05K 3/368; H05K 3/3447; H05K 7/1425; H05K 1/14; G06F 1/184; G06F 1/181; G06F 1/185; G06F 1/186; H02G 3/088; H02G 3/081; H02G 3/086
See application file for complete search history.

(56) References Cited

U.S. PATENT DOCUMENTS

| | | | | |
|---|---|---|---|---|
| 5,485,350 | A * | 1/1996 | Hecht et al. ................... | 361/692 |
| 5,641,953 | A * | 6/1997 | Fisher, Jr. ................... | 200/50.12 |
| 5,757,638 | A * | 5/1998 | Katooka et al. ............... | 363/146 |
| 5,825,630 | A * | 10/1998 | Taylor et al. ................... | 361/790 |
| 5,835,350 | A * | 11/1998 | Stevens ......................... | 361/704 |
| 5,995,380 | A * | 11/1999 | Maue et al. .................... | 361/826 |
| 6,853,553 | B2 * | 2/2005 | Seaton et al. ................. | 361/695 |
| 6,921,467 | B2 * | 7/2005 | Hanson et al. ................ | 204/212 |
| 7,212,407 | B2 * | 5/2007 | Beihoff et ..................... | 361/699 |

(Continued)

FOREIGN PATENT DOCUMENTS

| | | |
|---|---|---|
| CN | 101609741 A | 12/2009 |
| TW | M305550 U | 1/2007 |

(Continued)

OTHER PUBLICATIONS

Taiwan Official Action issued on Feb. 18, 2014.

*Primary Examiner* — Hoa C Nguyen
*Assistant Examiner* — Xanthia C Cunningham
(74) *Attorney, Agent, or Firm* — Chun-Ming Shih; HDLS IPR Services

(57) ABSTRACT

In a power supply module of a linear actuator and a conversion assembly thereof, the power supply module includes a casing (10), a circuit control unit (11), and a conversion assembly (2). The casing (10) is provided with a dividing plate (102) for dividing the interior of the casing (10) into a first space (103) and a second space (104). The circuit control unit (11) is disposed in the first space (103), and the conversion assembly (2) is disposed in the second space (104). The conversion assembly (2) further includes a circuit board set (20) and a frame (21). The circuit board set (20) is electrically connected with an inductive element(A), a rectifying element (B) and a filtering element(C). The circuit board set (20) is mounted onto the frame (21) to form a modular structure.

18 Claims, 5 Drawing Sheets

(56) References Cited

U.S. PATENT DOCUMENTS

| | | | |
|---|---|---|---|
| 7,289,329 B2 * | 10/2007 | Chen et al. | 361/707 |
| 7,710,721 B2 * | 5/2010 | Matsuo et al. | 361/699 |
| 7,940,532 B2 * | 5/2011 | Willing et al. | 361/807 |
| 8,067,690 B2 * | 11/2011 | Anders et al. | 174/50 |
| 8,289,709 B2 * | 10/2012 | Feltner et al. | 361/695 |
| 2009/0134718 A1 * | 5/2009 | Hurst et al. | 307/150 |
| 2009/0277604 A1 * | 11/2009 | Kang et al. | 165/56 |
| 2012/0072041 A1 * | 3/2012 | Miller et al. | 700/292 |

FOREIGN PATENT DOCUMENTS

| | | |
|---|---|---|
| TW | 200843288 A | 11/2008 |
| TW | 201027304 A | 7/2010 |
| TW | 201101002 A | 1/2011 |

* cited by examiner

POWER SUPPLY MODULE OF LINEAR ACTUATOR AND CONVERSION ASSEMBLY THEREOF

BACKGROUND OF THE INVENTION

1. Field of the Invention

The present invention relates to the modularization of a linear actuator, and in particular to a power supply module of a linear actuator and a conversion assembly thereof 2. Description of Prior Art FIG. 1 is a conventional exploded perspective view showing a power supply module of a linear actuator. The power supply module 1a has a casing constituted of a base 10a and an upper cover 11a, in which a control unit 12a and a transformer 13a are received. The interior of the base 10a is formed with a first space 14a for accommodating the control unit 12a, and a second space 15a for accommodating the transformer 13a. By this arrangement, a modular structure is obtained.

Traditionally, the transformer 13a in the power supply module 1a is an EI transformer which only has a voltage-converting function. Further, the EI transformer has a large weight and does not conform to the requirements for environmental protection. Thus, the EI transformer has to be replaced by a new type of transformer. The present invention aims to maintain the modular structure of the power supply module 1a and to accommodate new components therein.

In order to solve the above problems, the present Inventor proposes a novel and reasonable structure based on his expert knowledge and deliberate researches.

SUMMARY OF THE INVENTION

The present invention is to provide a power supply module of a linear actuator and a conversion assembly thereof. A rectifying element, a filtering element and etc. are arranged on a circuit board to form a voltage converter having rectifying and filtering functions. By this arrangement, the conventional EL transformer having a large weight and size can be replaced. Alternatively, a rectifying element and a filtering element are mounted in an internal space of the power supply module to achieve the rectifying and filtering functions.

The present invention provides a power supply module of a linear actuator, including a casing, a circuit control unit, and a conversion assembly. The casing is provided with a dividing plate for dividing the interior of the casing into a first space and a second space. The circuit control unit is disposed in the first space, and the conversion assembly is disposed in the second space. The conversion assembly further comprises a circuit board set and a frame. The circuit board set is electrically connected with an inductive element, a rectifying element and a filtering element. The circuit board set is mounted onto the frame to form a modular structure.

The present invention provides a conversion assembly of a power supply module of a linear actuator, which includes a circuit board set and a frame. The circuit board set is electrically connected with an inductive element, a rectifying element and a filtering element. The circuit board set is mounted onto the frame to form a modular structure.

DETAILED DESCRIPTION OF THE INVENTION

In order to make the Examiner to better understand the characteristics and technical contents of the present invention, a detailed description relating to thereto will be made with reference to the accompanying drawings. It is noteworthy to point out that the drawings is provided for the illustration purpose only, but not intended for limiting the scope of the present invention.

Figure 1:
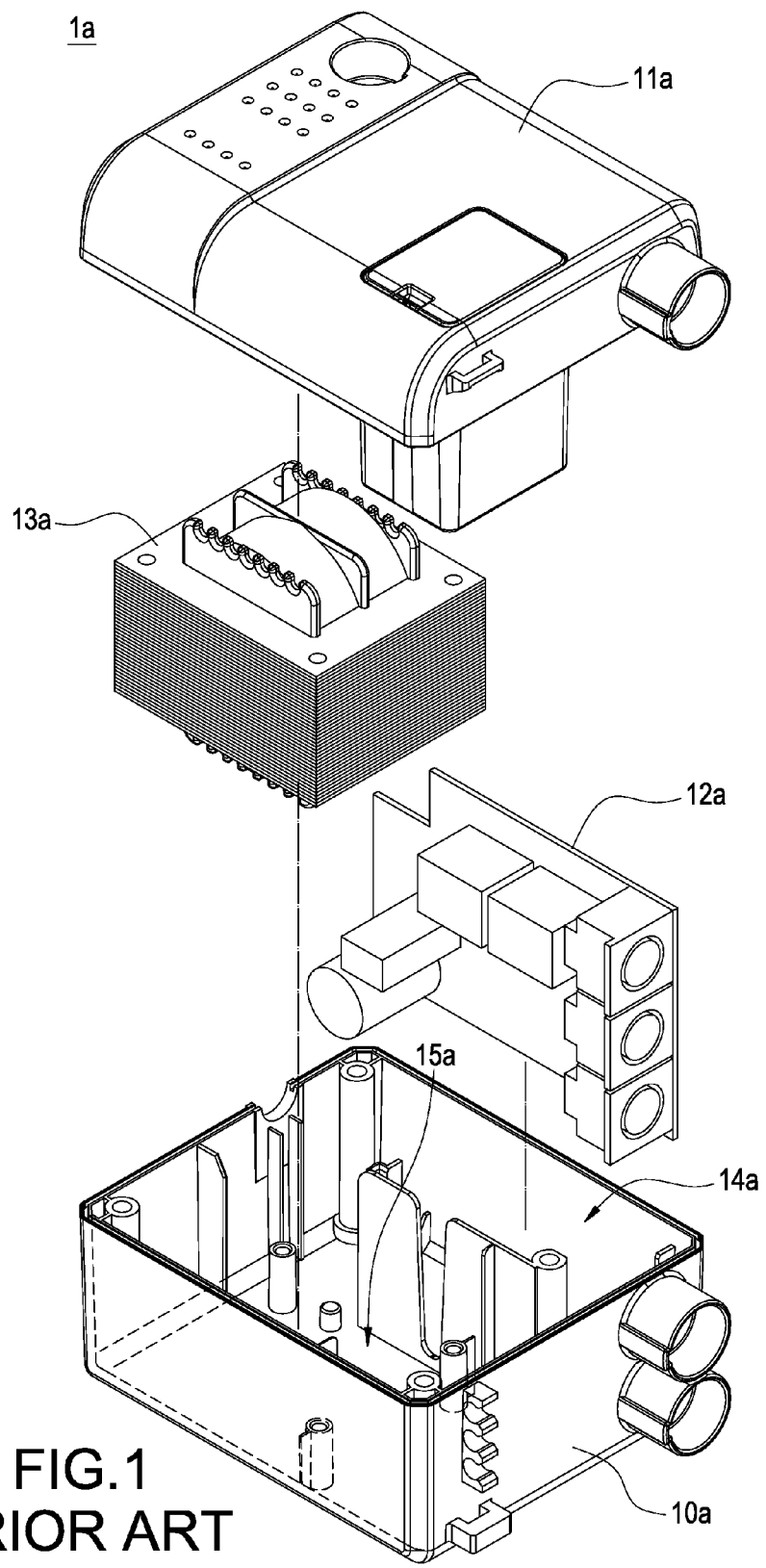
FIG. 1 is a conventional exploded perspective view showing a power supply module of a linear actuator.
Figure 2:
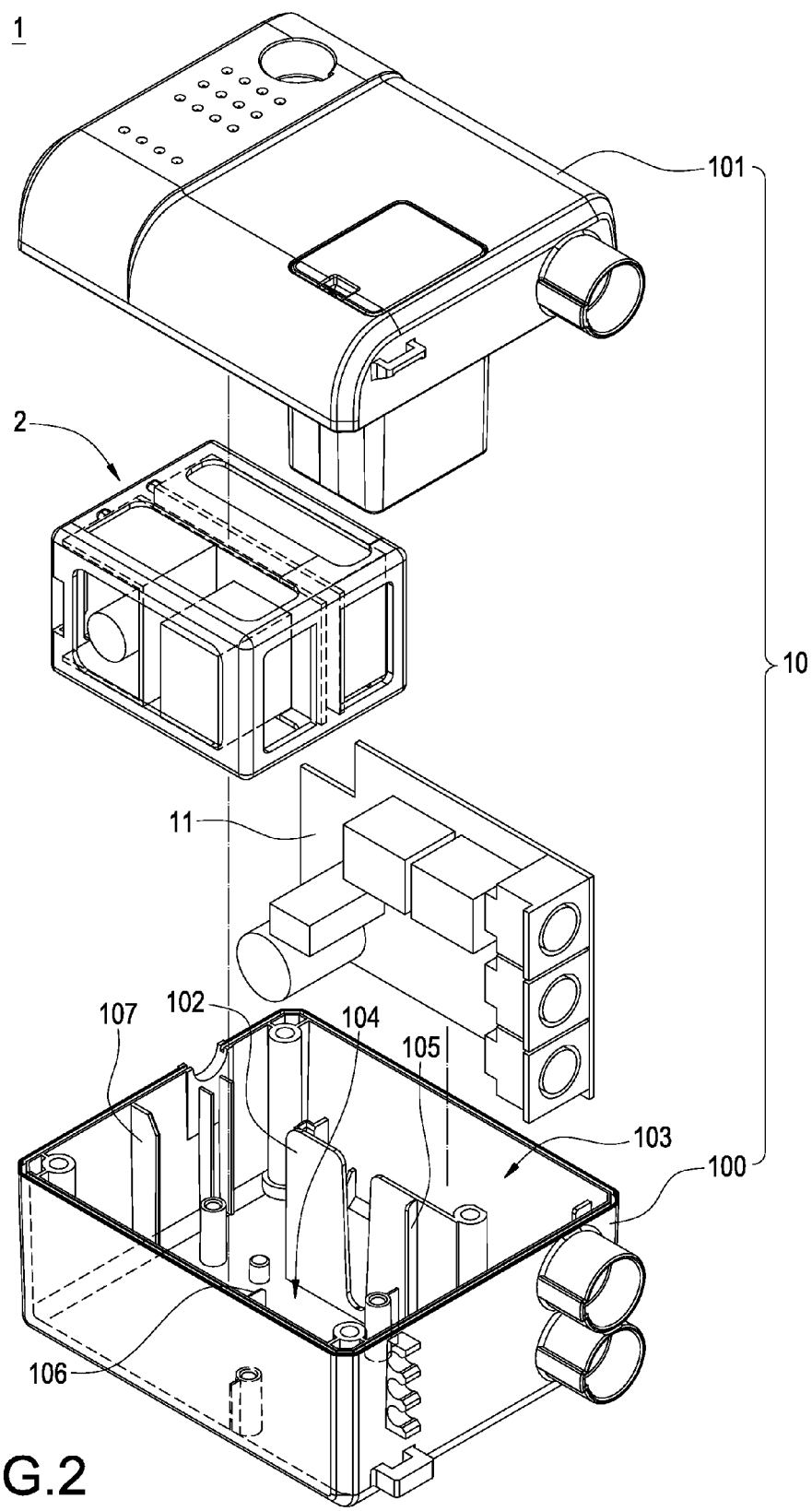
FIG. 2 is an exploded perspective view showing the power supply module of the present invention.
Figure 3:
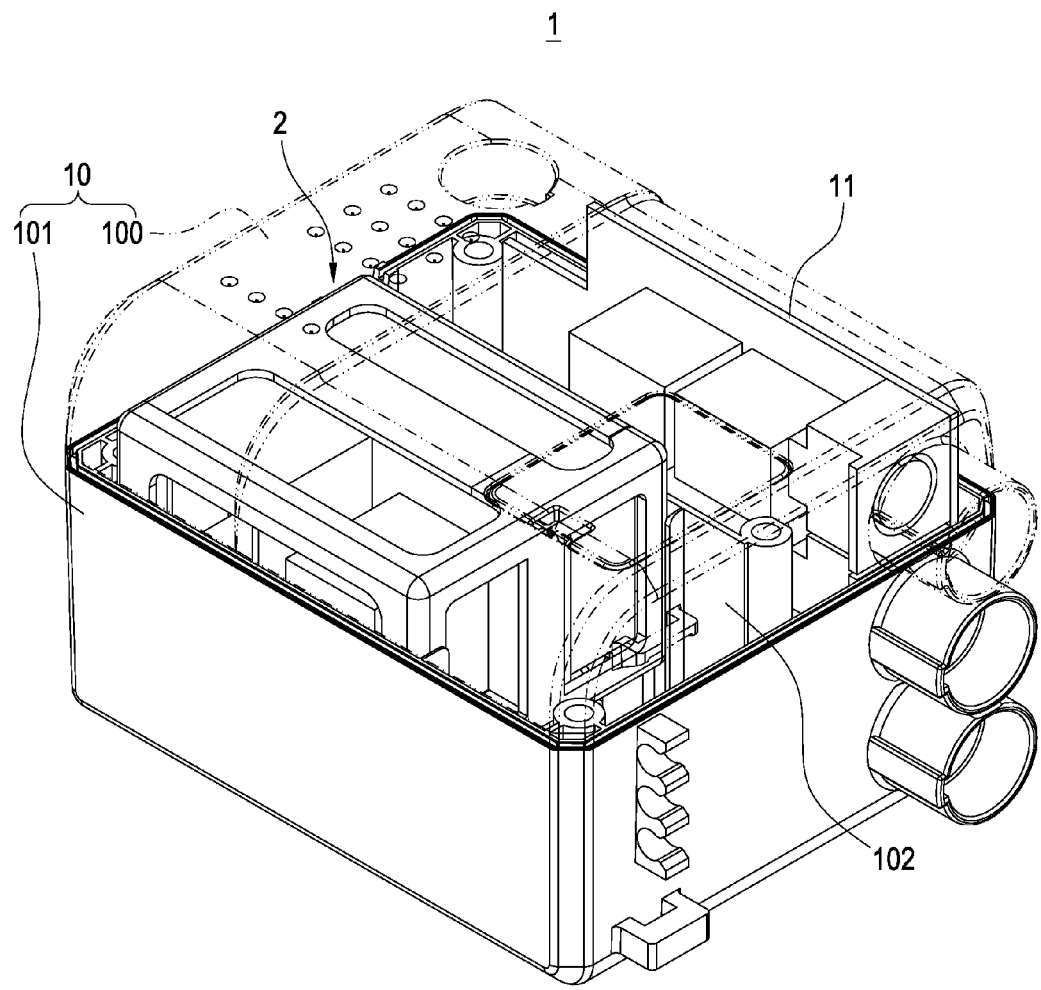
FIG. 3 is an assembled perspective view showing the power supply module of the present invention.

Please refer to FIGS. 2 and 3. FIG. 2 is an exploded perspective view showing the power supply module of the present invention, and FIG. 3 is an assembled perspective view showing the power supply module of the present invention. The power supply module 1 includes a casing 10, a circuit control unit 11 and a conversion assembly 2.

The casing 10 is configured to integrate the circuit control unit 11 and the conversion assembly 2. The casing 10 is constituted of a base 100 and an upper cover 101. The base 100 is provided with a dividing plate 102 for dividing the interior of the casing 10 into a first space 103 and a second space 104. The power control unit 11 is disposed in the first space 103. The conversion assembly 2 is disposed in the second space 104. By this arrangement, the casing 10 can integrate the respective components of the power supply module 1 into a modular structure.

Figure 4:
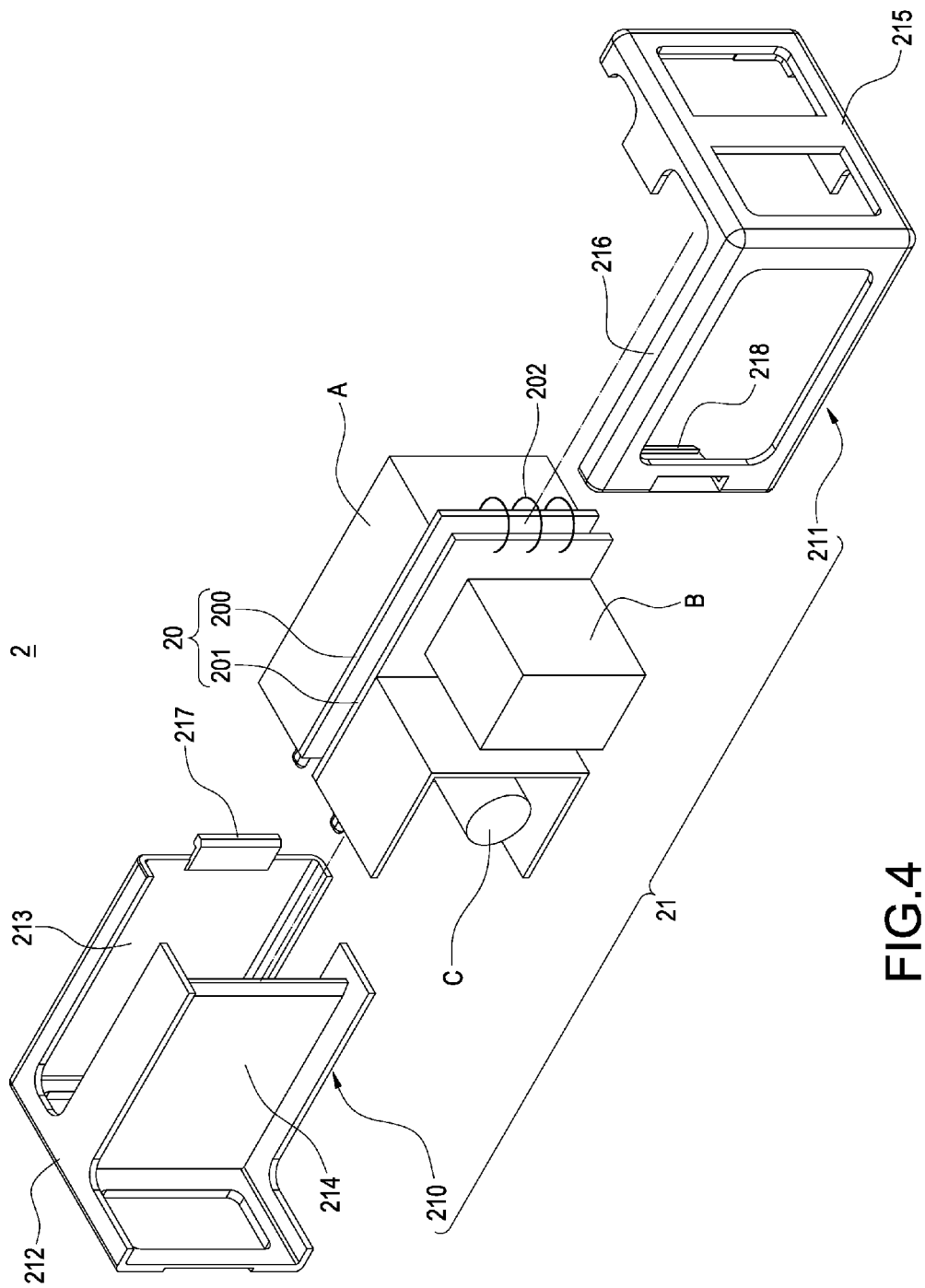
FIG. 4 is an exploded perspective view showing the conversion assembly of the present invention.

Please also refer to FIG. 4. The conversion module 2 includes a circuit board set 20 and a frame 21 for allowing the circuit board set 20 to be mounted thereon. The frame 21 is accommodated in the second space 104. The circuit board set 20 is electrically connected with an inductive element A, a rectifying element B, and a filtering element C. In the present embodiment, the circuit board set 20 is constituted of a first circuit board 200 and a second circuit board 201. Cables or electric wires are used to electrically connect the first circuit board 200 and the second circuit board 201. In this way, a surface of the first circuit board 200 can be adhered to a surface of the second circuit board 201, so that the inductive element A, the rectifying element B and the filtering element C can be arranged on the first circuit board 200 and the second circuit board 201.

The frame 21 comprises a frame base 210 and a frame cover 211. The circuit board set 20 is sandwiched between the frame base 210 and the frame cover 211. The frame base 210 has a first side plate 212. One end of the first side plate 212 is provided with a first base plate 213. The first side plate 212 is provided with a second base plate 214 separated from the first base plate 213 by an interval. The first circuit board 200 of the circuit board set 10 is accommodated between the first base plate 213 and the second base plate 214. The frame cover 211 has a second side plate 215. One end of the second side plate 213 is provided with a cover plate 216. The cover plate 216 is separated from the second base plate 214 of the frame base 210 by an interval, so that the second circuit board 201 of the circuit board set 20 is accommodated between the second base plate 214 and the cover plate 216. The distal edge of the first base plate 213 is provided with a first buckling portion 217. The first buckling portion 217 outwardly buckles the inner edge of the other end of the second side plate 215. The other end of the first side plate 213 of the frame base 210 is assembled with the distal edge of the cover plate 216 of the frame cover 211. The distal edge of the cover plate 216 is provided with a second buckling portion 218. The second buckling portion 218 inwardly buckles the outer edge of the other end of the first side plate 213. In this way, the frame 21 can be obtained, in which the circuit board set 20 is mounted.

It should be noted that the first side plate 212, the second side plate 215, and the cover plate 216 of the frame 21 may be hollowed to facilitate the heat dissipation of the conversion assembly 2 or the electrical connection with other external components.

With the above structure, the power supply module of a linear actuator and the conversion assembly thereof can be obtained.

Figure 5:
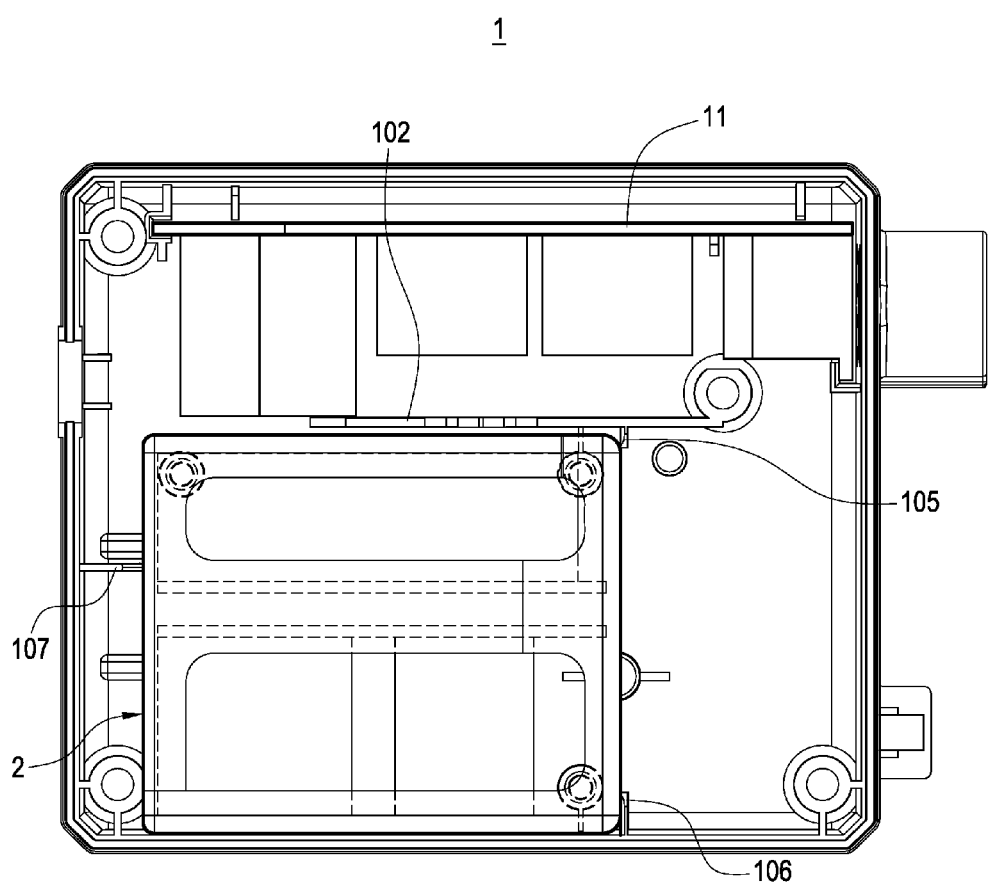
FIG. 5 is a plan view showing the conversion assembly is mounted in the power supply module of the present invention.

As shown in FIG. 5, since the circuit board set 20 of the conversion assembly 2 is connected with the inductive element, the conversion assembly 2 has a voltage-converting function, thereby replacing the traditional EI transformer having a large weight and size. Further, the rectifying element and the filtering element are integrated onto the circuit board set 20. Thus, in the second space 104 of the power supply module 1, the conversion assembly 2 can act as a voltage converter having rectifying and filtering functions. The frame 21 is configured to allow the circuit board set 20 to be mounted in the second space 104 of the power supply module 1 in a modular manner. In order to facilitate the positioning of the conversion assembly 2 into the second space 104, both inner side walls of the second space 104 are provided with a flange 105, 106 respectively for abutting against one side of the conversion assembly 2. Another inner side wall of the second space 104 is provided with a protruding edge 107 for abutting against the other side of the conversion assembly 2. By the above three-point positioning, the conversion assembly 2 can be positioned in the second space 104.

According to the above, the present invention really achieves the desired objects and solves the problems of prior art. Further, the present invention indeed demonstrates novelty and inventive steps, which conforms to the requirements for an invention patient.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A power supply module of a linear actuator, including:
    a casing (10) provided a dividing plate (102) for dividing the interior of the casing (10) into a first space (103) and a second space (104);
    a circuit control unit (11) disposed in the first space (103); and
    a conversion assembly (2) disposed in the second space (104), the conversion assembly (2) further comprising a circuit board set (20) and a frame (21), the circuit board set (20) being electrically connected with an inductive element (A), a rectifying element (B) and a filtering element (C), the circuit board set (20) being mounted onto the frame (21) to form a modular structure;
    wherein the circuit board set (20) of the conversion assembly (2) is constituted of a first circuit board (200) and a second circuit board (201), the first circuit board (200) has a first surface and a second surface opposite to the first surface; the second circuit board (201) has a third surface and fourth surface opposite to the third surface; the inductive element (A), the rectifying element (B) and the filtering element (C) are provided on the first surface and the third surface; the second surface is adhered to the fourth surface.

2. The power supply module of a linear actuator according to claim 1, wherein the casing (10) comprises a base (100) and an upper cover (101), the dividing plate (102) is located in the base (100).

3. The power supply module of a linear actuator according to claim 2, wherein both inner side walls of the second space (104) are provided with a flange (105, 106) respectively for abutting against one side of the conversion assembly (2), and another inner side wall of the second space (104) is provided with a protruding flange (107) for abutting against the other side of the conversion assembly (2).

4. The power supply module of a linear actuator according to claim 1, wherein the first circuit board (200) is electrically connected with the second circuit board (201) by an electrically-connecting element (202).

5. The power supply module of a linear actuator according to claim 4, wherein the electrically-connecting element (202) is a cable or electric wire.

6. The power supply module of a linear actuator according to claim 1, wherein the frame (21) comprises a frame base (210) and a frame cover (211), and the circuit board set (20) is sandwiched between the frame base (210) and the frame cover (211).

7. The power supply module of a linear actuator according to claim 6, wherein the frame base (210) has a first side plate (212), one end of the first side plate (212) is provided with a first base plate (213), the first side plate (212) is provided with a second base plate (214) separated from the first base plate (213) by an interval, the first circuit board (202) is accommodated between the first base plate (213) and the second base plate (214), the frame cover (211) has a second side plate (215), one end of the second side plate (215) is provided with a cover plate (216), the cover plate (216) is separated from the second base plate (214) by an interval, and the second circuit board (201) is accommodated between the second base plate (214) and the cover plate (216).

8. The power supply module of a linear actuator according to claim 7, wherein a distal edge of the first base plate (213) is assembled with another end of the second side plate (215), and another end of the first side plate (212) is assembled with a distal edge of the cover plate (216).

9. The power supply module of a linear actuator according to claim 8, wherein a distal edge of the first base plate (213) is provided with a first buckling portion (217), the first buckling portion (217) outwardly buckles the inner edge of another end of the second side plate (215), a distal edge of the cover plate (216) is provided with a second buckling portion (218), and the second buckling portion (218) inwardly buckles the outer edge of another end of the first side plate (212).

10. The power supply module of a linear actuator according to claim 7, wherein the first side plate (212), the second side plate (215), and the cover plate (216) are hollowed.

11. A conversion assembly of a power supply module of a linear actuator, including:
    a circuit board set (20) electrically connected with an inductive element(A), a rectifying element(B), and a filtering element(C); and
    a frame (21) configured to allow the circuit board set (20) to be mounted thereto to form a modular structure,
    wherein the circuit board set (20) is constituted of a first circuit board (200) and a second circuit board (201), the first circuit board (200) has a first surface and a second surface opposite to the first surface; the second circuit board (201) has a third surface and fourth surface opposite to the third surface; the inductive element (A), the rectifying element (B) and the filtering element (C) are provided on the first surface and the third surface; the second surface is adhered to the fourth surface.

12. The conversion assembly of a power supply module of a linear actuator according to claim 11, wherein the first circuit board (200) is electrically connected with the second circuit board (201) by an electrically-connecting element (202).

13. The conversion assembly of a power supply module of a linear actuator according to claim 12, wherein the electrically-connecting element (202) is a cable or electric wire.

14. The conversion assembly of a power supply module of a linear actuator according to claim 11, wherein the frame (21) comprises a frame base (210) and a frame cover (211), and the circuit board set (20) is sandwiched between the frame base (210) and the frame cover (211).

15. The conversion assembly of a power supply module of a linear actuator according to claim 14, wherein the frame base (210) has a first side plate (212), one end of the first side plate (212) is provided with a first base plate (213), the first side plate (212) is provided with a second base plate (214) separated from the first base plate (213) by an interval, the first circuit board (202) is accommodated between the first base plate (213) and the second base plate (214), the frame cover (211) has a second side plate (215), one end of the second side plate (215) is provided with a cover plate (216), the cover plate (216) is separated from the second base plate (214) by an interval, and the second circuit board (201) is accommodated between the second base plate (214) and the cover plate (216).

16. The conversion assembly of a power supply module of a linear actuator according to claim 15, wherein a distal edge of the first base plate (213) is assembled with another end of the second side plate (215), and another end of the first side plate (212) is assembled with a distal edge of the cover plate (216).

17. The conversion assembly of a power supply module of a linear actuator according to claim 16, wherein a distal edge of the first base plate (213) is provided with a first buckling portion (217), the first buckling portion (217) outwardly buckles the inner edge of another end of the second side plate (215), a distal edge of the cover plate (216) is provided with a second buckling portion (218), and the second buckling portion (218) inwardly buckles the outer edge of another end of the first side plate (212).

18. The conversion assembly of a power supply module of a linear actuator according to claim 15, wherein the first side plate (212), the second side plate (215), and the cover plate (216) are hollowed.

* * * * *